United States Patent [19]

Mallory

[11] Patent Number: 4,646,009
[45] Date of Patent: Feb. 24, 1987

[54] CONTACTS FOR CONDUCTIVITY-TYPE SENSORS

[75] Inventor: Roy Mallory, Bedford, Mass.

[73] Assignee: ADE Corporation, Newton, Mass.

[21] Appl. No.: 725,160

[22] Filed: Apr. 22, 1985

Related U.S. Application Data

[63] Continuation of Ser. No. 379,563, May 18, 1982, abandoned.

[51] Int. Cl.[4] ............................................. G01R 31/26
[52] U.S. Cl. ............................ 324/158 R; 324/158 D
[58] Field of Search ........... 324/158 R, 158 D, 158 T; 361/212, 220

[56] References Cited

U.S. PATENT DOCUMENTS

| | | |
|---|---|---|
| 2,475,356 | 7/1949 | Meschter ............................ 361/212 |
| 3,039,604 | 6/1962 | Bickel et al. . |
| 3,389,532 | 7/1975 | Brooks . |
| 3,531,716 | 9/1970 | Taru et al. . |
| 3,549,999 | 12/1970 | Norton . |
| 3,560,849 | 2/1971 | Ryan et al. . |
| 3,568,831 | 3/1971 | Penberg . |
| 3,583,561 | 6/1971 | Wiesler . |
| 3,623,818 | 11/1971 | Gardner . |
| 3,628,137 | 12/1971 | Mazur . |
| 3,677,401 | 7/1972 | Chaparro et al. . |
| 3,697,873 | 10/1972 | Mazur . |
| 3,735,254 | 5/1973 | Severin . |
| 3,745,454 | 7/1973 | Nikick et al. . |
| 3,748,579 | 7/1973 | Henry et al. . |
| 3,766,638 | 10/1973 | Moore . |
| 3,802,774 | 4/1974 | Eschler et al. . |
| 3,805,160 | 4/1974 | Philbrick et al. . |
| 3,811,182 | 5/1974 | Ryan, Sr. et al. . |
| 3,840,303 | 10/1974 | Clarke . |
| 3,840,809 | 10/1974 | Yun . |
| 3,845,286 | 10/1974 | Aroustein et al. . |
| 3,863,108 | 1/1975 | Blyth et al. . |
| 3,869,211 | 3/1975 | Watanabe et al. . |
| 3,883,800 | 5/1975 | Dupont . |
| 3,939,415 | 2/1976 | Terasawa . |
| 3,941,985 | 3/1976 | Dawase et al. . |
| 3,949,926 | 4/1976 | Diepeveen . |
| 3,984,767 | 10/1976 | Dekton et al. . |
| 3,996,517 | 12/1976 | Fergason et al. . |
| 4,011,500 | 3/1977 | Pelletier et al. . |
| 4,030,622 | 6/1977 | Brooks et al. . |
| 4,051,437 | 9/1977 | Lile et al. . |

List Continued on next page.

OTHER PUBLICATIONS

ASTM Designation F42-68T, "Tentative Methods of Test for Conductivity Type of Extrinsic Semiconducting Materials", 1968.

*Primary Examiner*—Reinhard J. Eisenzopf
*Assistant Examiner*—Stephen M. Baker
*Attorney, Agent, or Firm*—Weingarten, Schurgin, Gagnebin & Hayes

[57] ABSTRACT

A conductivity-type sensor, typically for use in a wafer sorting system, for detecting the conductivity-type of semiconductor wafers. In measuring conductivity, a two-contact probe is applied to the semiconductor wafer and any static charge which may have been accumulated on the wafer is initially discharged at an accelerated rate. The charge state is measured and an acceptable level of discharge requires repeated indications of discharge below a predetermined level. Discharging and charge measurement is repeated a predetermined number of times as necessary to accomplish discharging or the wafer identified as defective. The conductivity-type of the discharged wafer is read from the rectified polarity of an oscillating signal applied to the contacts. A valid indication of conductivity-type requires two consecutive readings of the same conductivity-type. The consecutive readings can be either the first reading of a new wafer identical with the reading of a previous wafer or two consecutive identical readings on the same wafer. Each reading, to be considered an acceptable reading of conductivity-type requires five consecutive, identical conductivity measurements over a predetermined time interval. Failure of such criteria produces a wafer defect indication.

3 Claims, 6 Drawing Figures

U.S. PATENT DOCUMENTS

| | | |
|---|---|---|
| 4,063,172 | 12/1977 | Faure et al. . |
| 4,068,955 | 1/1978 | Bodlaj . |
| 4,071,820 | 1/1978 | Mushinsky . |
| 4,088,411 | 5/1978 | Ahlquist et al. . |
| 4,103,226 | 7/1978 | Fromson et al. . |
| 4,103,542 | 8/1978 | Wheeler et al. . |
| 4,112,309 | 9/1978 | Nakazawa et al. . |
| 4,123,352 | 10/1978 | Yamamoto et al. . |
| 4,128,174 | 12/1978 | Frisbic et al. . |
| 4,130,150 | 12/1978 | Cook et al. . |
| 4,130,796 | 12/1978 | Shum . |
| 4,132,037 | 1/1979 | Bonora . |
| 4,134,486 | 1/1979 | Grone . |
| 4,138,018 | 2/1979 | Daebler et al. . |
| 4,141,458 | 2/1979 | Brooks et al. . |
| 4,157,139 | 6/1979 | Bjork . |
| 4,166,029 | 8/1979 | Rhotert . |
| 4,168,437 | 9/1979 | Nihonmatsu . |
| 4,173,821 | 11/1979 | Yamamoto et al. . |
| 4,175,441 | 11/1979 | Urbanek et al. . |
| 4,181,881 | 1/1980 | Preikschat . |
| 4,182,981 | 1/1980 | Shum et al. . |
| 4,189,825 | 2/1980 | Robillard et al. . |
| 4,190,797 | 2/1980 | Lecklider et al. . |
| 4,190,799 | 2/1980 | Miller et al. . |
| 4,194,324 | 3/1980 | Bonora et al. . |
| 4,217,977 | 8/1980 | Tam . |
| 4,224,565 | 9/1980 | Sosniak et al. . |
| 4,227,149 | 10/1980 | Faure et al. . |
| 4,227,182 | 10/1980 | Ogasawara et al. . |
| 4,227,347 | 10/1980 | Tam . |
| 4,259,003 | 3/1981 | Mangal et al. ............... 361/212 X |
| 4,263,546 | 4/1981 | Morris . |
| 4,275,978 | 6/1981 | Brooks et al. . |
| 4,280,354 | 7/1981 | Wheeler et al. . |
| 4,282,184 | 8/1981 | Fiegl et al. . |
| 4,282,483 | 8/1981 | Kren et al. ................... 324/158 R |
| 4,284,947 | 8/1981 | Walton . |
| 4,285,053 | 8/1981 | Kren et al. . |
| 4,286,215 | 8/1981 | Miller . |
| 4,290,008 | 9/1981 | Hoshino et al. . |
| 4,301,958 | 11/1981 | Hatakenaka et al. . |
| 4,302,721 | 11/1981 | Urbanek et al. . |
| 4,311,392 | 1/1982 | Yazaki et al. . |
| 4,313,266 | 2/1982 | Tam . |
| 4,316,231 | 2/1982 | Michel ........................... 361/220 |
| 4,318,465 | 3/1982 | Calvert et al. . |
| 4,326,165 | 4/1982 | Szeden et al. ............... 324/158 R |
| 4,518,349 | 5/1985 | Tressler et al. . |

CONTACTS FOR CONDUCTIVITY-TYPE SENSORS

This application is a continuation of application Ser. No. 379,563, filed May 18, 1982, now abandoned.

FIELD AND BACKGROUND OF THE INVENTION

Semiconductor wafers, as they come cut from a crystal of doped silicon, and prior to their fabrication as integrated circuits, are typically sorted in accordance with various electrical characteristics. Automated equipment has evolved to accomplish this function, and it is desired that the detection of conductivity-type in the wafer, whether N- or P-type, be provided in such sorting systems.

The detection of wafer conductivity-type is made difficult by the presence of static charge on the semiconductor wafer which normally occurs during automated or other handling of such wafers. The existence of a charge will create in many cases an erroneous indication of conductivity-type. The charge must therefore be deleted from the wafer before measurement of conductivity-type, at least in the area of probing. Charge elimination, due to the exponential character of discharge curves, is a time consuming operation, and even when conducted for an extended period of time will not completely discharge the wafer. Even though apparently fully discharged, charge may spread back into the probed region of the wafer from peripheral regions or from other sources. The presence of any such charge will tend to distort any reading of conductivity-type made. Therefore, a high degree of security is required in wafer discharging in combination with a relatively fast discharge function.

The reading of conductivity type in acceptably discharged wafers is subject to errors or uncertainty probabilities of sufficient magnitudes as to impair the value of automated conductivity-type testing. A major source of such error is the difficulty in getting good rectifying contact to a silicon wafer. Many of these cannot be eliminated from automated conductivity-type testing instrumentation without creating substantial problems in handling speed or equipment expense. Another mechanism is required, however, for increasing the reliability of conductivity-type measurement.

SUMMARY OF THE INVENTION

In accordance with the teaching of the present invention, an automated semiconductor wafer conductivity-type gauge is provided in which a substantial increase is made in the reliability and security of wafer discharge and subsequent conductivity type reading. In addition, the rate at which wafer discharge is accomplished is drastically increased.

In the present invention, and in particular in a preferred embodiment thereof, as each wafer is fed into the conductivity-type gauge station a pair of probe contacts are raised into electrical contact with a surface of the wafer at points separated by a small fraction of an inch. A wafer charge sensor, connected to the probe contacts, provides an indication of the magnitude of electrostatic charge on the wafer between the probes. A discharge circuit is selectively enabled to apply an opposite voltage level to the semiconductor wafer through the probe contacts for a predetermined interval of time. The predetermined interval is selected, in conjunction with the time constant of the discharging circuitry, in order to rapidly drive the semiconductor wafer charge state to a complete discharge condition. In this manner the charge in the semiconductor wafer, in being driven toward an opposite charge state, is made to rapidly approach the zero charge state. The time at which this zero charge state is reached is a function of the discharge circuit time constant. A rapid wafer discharge is therefore accomplished.

Once discharge is achieved in this manner, the charge condition of the wafer is sensed and required to be below a predetermined threshold at at least two consecutive points in time. A predetermined number of tries are made to achieve these two consecutive indications of discharge and if not achieved, the wafer is again subject to the discharge function by application of an opposite discharging potential. This entire cycle is repeated a predetermined number of times in an effort to achieve the condition of consecutive indications of discharge. If they are not achieved at the end of the predetermined number of retries, the wafer is labeled as defective and passed on.

Once an indication is received of an acceptably discharged wafer the probe contacts the wafer in order to read conductivity type. For this purpose, the output of an RF oscillator is applied to the probe contacts and the rectification effect of the semiconductor material, a function of its conductivity-type, is detected. The detection circuitry will provide either an indication of an N or a P type or fail to provide an acceptable indication. This detecting function is accomplished by reading the probe output every 10 milliseconds of time up to a total of 0.5 seconds in one embodiment. A valid reading of wafer type requires at least 5 consecutive indications of identical conductivity-type each separated by the 10 millisecond read intervals. If this is not achieved within the half second interval, the discharge cycle is reinitiated and an attempt to read the conductivity-type is not made again until an acceptable indication of discharge as indicated above is provided. The reading function is included within the discharge loop so that a failure to achieve a successful reading of five consecutive identical type indications repeatedly will have the same effect as a failure to achieve two consecutive indications of wafer discharge state, i.e., aborting the gauging function on the wafer under test and passing it on with an indication of a defective condition.

A final level of conductivity-type gauging security is provided by requiring that at least two consecutive successful readings of the same conductivity-type be made. This condition can be satisfied if the first successful reading on a new wafer is of the same conductivity-type as the reading of conductivity-type on the last wafer, the statistics favoring consistency in conductivity-type from wafer to wafer. Failing this test, two consecutive successful readings of the same conductivity-type on the same wafer provides an acceptable indication of conductivity. If the required consecutive readings are not achieved within a predetermined number of tries, the wafer is passed along with an indication of a defective state.

DESCRIPTION OF THE DRAWING

These and other features of the present invention are more fully set forth below in the solely exemplary detailed description and accompanying drawing of which.

DETAILED DESCRIPTION

The present invention contemplates a system for providing conductivity-type gauging of semiconductor wafers. In particular the present invention provides for an increase in reliability and efficiency of type gauging by providing accelerated wafer discharge before type reading in combination with increased security in achieving an acceptable wafer discharge. In addition, the reliability of conductivity-type readings is increased by two levels of reiterative reading checks which require consecutive, identical type readings, first to establish an initial, successful reading and then to require consecutive identical successful readings for additional security.

Figure 1A:
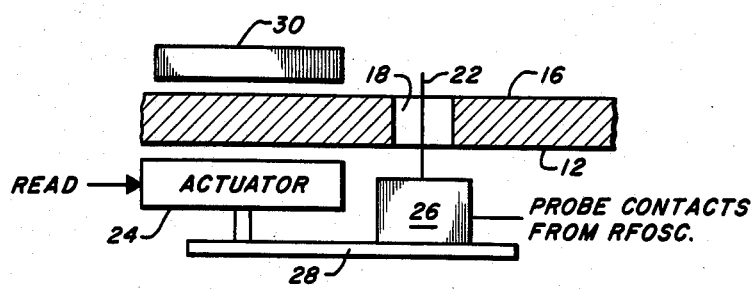
FIGS. 1A & 1B are respectively a sectioned elevation and partial top view of apparatus at a conductivity-type gauging station according to the present invention.
Figure 1B:
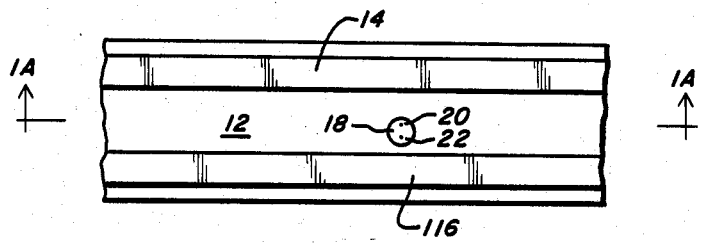

A type gauging system includes a station as illustrated in FIGS. 1A and 1B in which a support plate 12 having first and second conveyer belts 14 and 16 transport a semiconductor wafer along the support plate 12 to an aperture 18 through which first and second contacts 20 and 22 of a probe are selectively raised and lowered by an actuator 24. The contacts 20 and 22 are supported by a probe housing 26 on an arm 28 controlled by the actuator 24 in vertical position. In a raised or elevated position, the contacts 20 and 22 are positioned to contact the underside of a semiconductor wafer 30 after it is positioned by motion of the belts 14 and 16 over the aperture 18. In the lowered position, the probe contacts 20 and 22 are lowered out of contact with the wafer 30.

Figure 2:
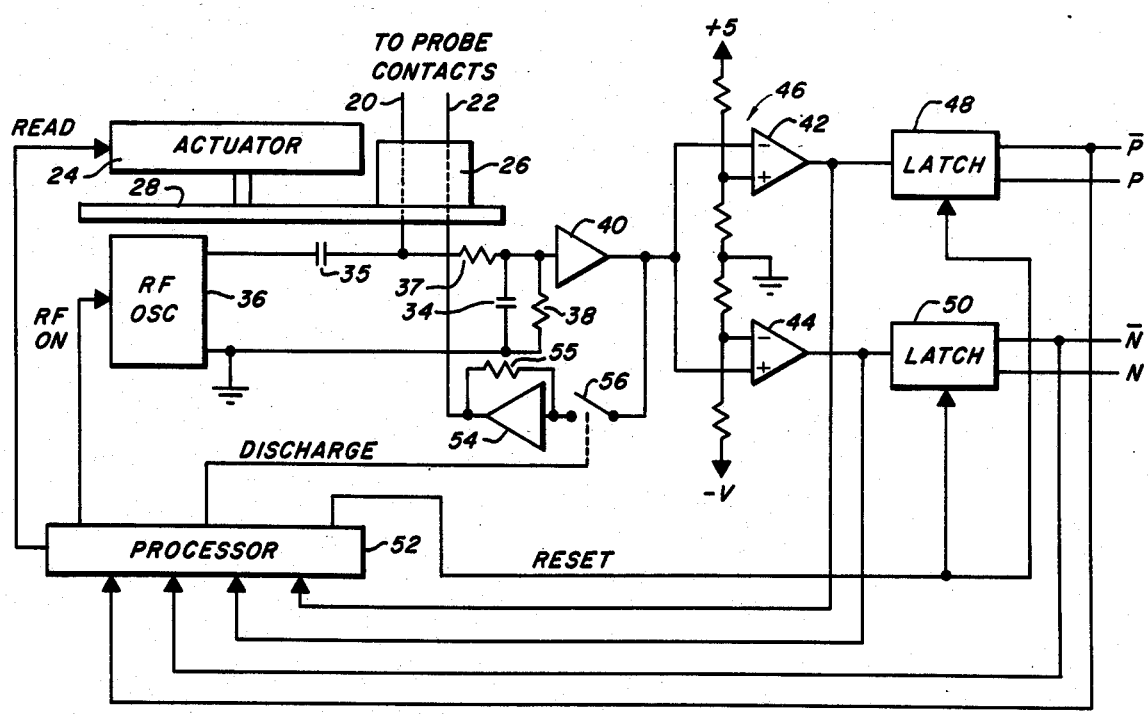
FIG. 2 is a circuit diagram of circuitry for providing semiconductor wafer discharge and conductivity-type detection functions.

The circuitry associated with the mechanism of FIGS. 1A and 1B is illustrated in FIG. 2. Contacts 20 and 22 must provide a reliable, repeatable rectifying contact with the wafer, a condition not easy to achieve. As presently understood, a sharp contact point is helpful to this goal and contact tips fabricated of tungsten carbide, a material harder than the silicon of the wafer, are preferred. An RF oscillator 36 applies its high side output through a capacitor 35 to contact 20. The low side of oscillator 36 is at circuit common and probe contact 22 is held at this potential by the output of an operational amplifier 54, except during discharge as explained below. Contact 20 is connected through a resistor 37 to the input of an amplifier 40. A low-pass filter is formed by resistor 37 and a parallel combination of capacitor 34 and resistor 38 connected between the input of amplifier 40 and common.

The output of buffer amplifier 40 is applied to inverting and noninverting inputs respectively of comparator amplifiers 42 and 44. The other inputs of the comparators 42 and 44 receive a reference signal from a voltage divider network 46 that establishes a threshold for both identification of acceptable discharge levels and conductivity type indication as explained below. The output of the comparators 42 and 44 are applied to respective latch circuits 48 and 50 which function to hold a positive indication of the output of their corresponding comparators 42 and 44. The outputs of the latch circuits 48 and 50 and of comparators 42 and 44 provide P or N type indicating sgnals to a processor 52. The processor 52, operative in accordance with the algorithms of FIGS. 3 and 4 below, provides a reset signal to the latch circuits 48 and 50 and a read signal to the actuator 24, causing it to elevate the probes 20 and 22 into contact with a semiconductor wafer positioned above the aperture 18. The processor 52 also provides an activation signal to the RF oscillator 36.

A discharge circuit is provided having an operational amplifier 54 and feedback resistor 55 selectively connected between the output of amplifier 40, by means of a switch 56, and the probe contact 22. Processor 52 controls the switch 56, closing it to provide a wafer discharge function which in turn applies to the probe contact 22 a signal reversing the charge previously sensed across the probes 20 and 22 driving that charge in the opposite direction for a predetermined interval. The interval is selected in accordance with the time constants of the discharge circuit in order to achieve complete discharge of the circuit in that interval. Since the dischage curve followed by the discharge circuit passes well beyond the zero charge condition, the asymptotic portion of the discharge curve is never reached and discharge to the zero discharge state is achieved far more rapidly.

Figure 3A:
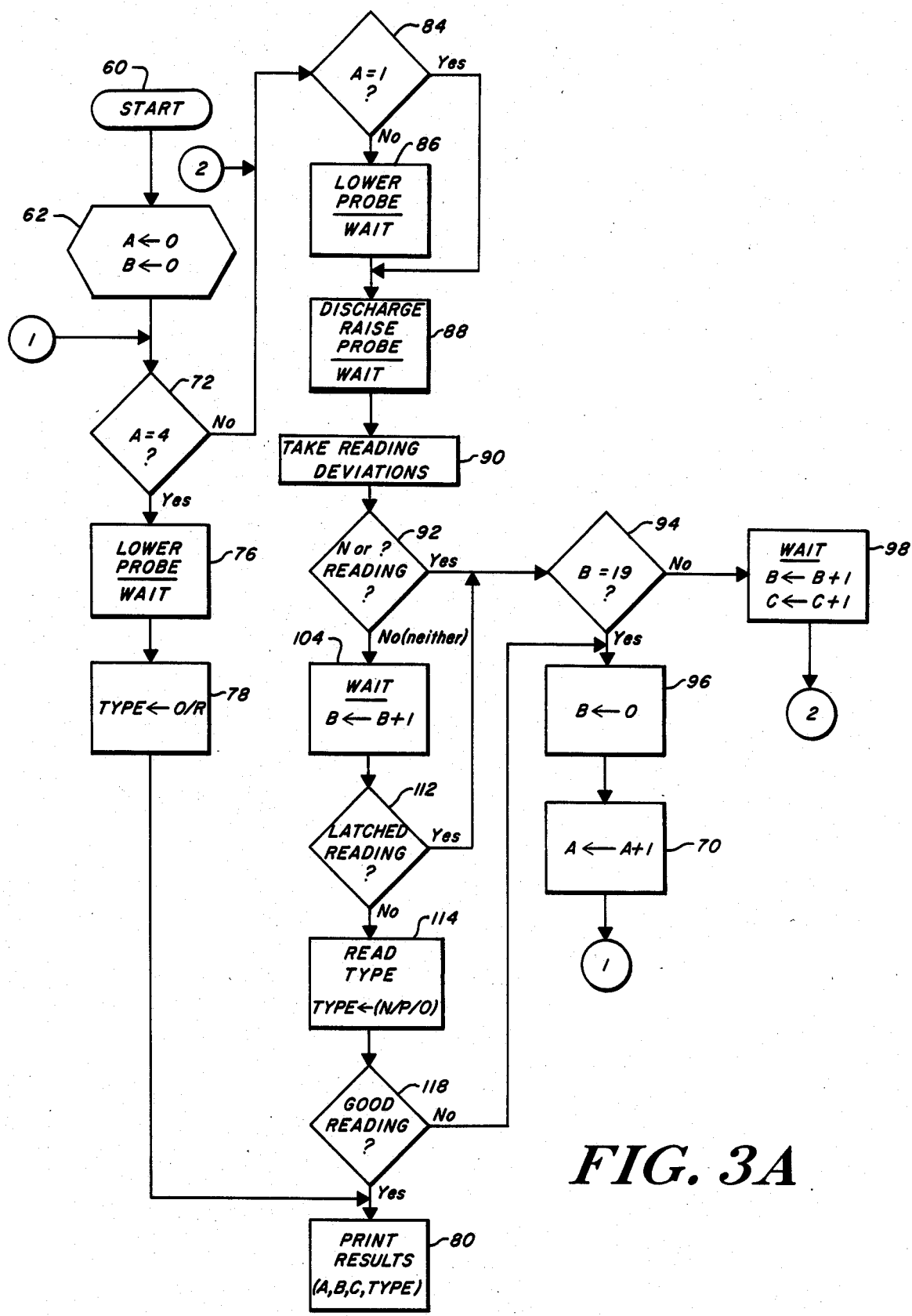
FIGS. 3A and 3B are algorithms according to the present invention showing processor controlled operation of the circuitry of FIG. 2 to accomplish wafer discharge and individual conductivity-type wafer readings.

The operation of the processor 52 to provide verified, acceptable discharge of the semiconductor wafer and a subsequent, validated reading of conductivity-type is illustrated in FIG. 3A. As shown there, from a start state 60 initiated, for example after transport of wafer by belts 14 and 16 to a position above the aperture 18, processing proceeds through an initialization step 62 that resets counters designated A and B which are used to limit the total number of discharge cycles and the number of attempts to read a successful discharge within a discharge cycle as described below. A subsequent test step 72 checks whether the number of discharge retries has reached the designated maximum. If the maximum retry number has been reached, a step 76 lowers the probe, in preparation for transporting the wafer away, and a subsequent step 78 sets an indication of an over range condition which is followed by a step 80 printing the test result, in this case an indication of a defective or failed wafer test. After step 80 the system returns to an idle state until a subsequent wafer is available for testing triggering start step 60.

Branching from test step 72 to step 76 presumes that several discharge or discharge and read cycles have failed to produce an acceptable discharge reading or have produced an acceptable discharge reading in combination with an unacceptable reading of conductivity-type. Normally test 72 will indicate that the limit of retries has not been reached. In that case, a subsequent test 84 checks for the setting of the A counter keeping track of the number of times the wafer charge is discharged. If this counter indicates that this is not the first discharge attempt, a step 86 lowers the probe in conjunction with a 50 millisecond delay in order to let the probe settle. After step 86, or if in test 84 the count indicated the first discharge cycle was in process, a subsequent step 88 is entered in which the discharge circuit is activated by closing switch 56. The probe contacts are raised into contact with the semiconductor wafer and a predetermined time interval, in this example 50 milliseconds, allowed to pass to insure discharge to the zero charge condition as noted above. Subsequent to step 88, a step 90 reads the output of the comparators 42 and 44 and clears latches 48 and 50. A decision step 92 determines whether any output is present at either comparator, indicative of a signal applied to one or the other comparator exceeding the threshold established by the voltage divider 46. This threshold is selected to provide a minimum acceptable discharge level.

If any reading is detected in decision step 92, processing branches to a decision step 94 which tests counter B to determine whether the loop through steps 90 and 92 has been conducted more than a predetermined number of times, such as 19, set as the maximum number of attempts to read a discharge condition from a single discharge operation. If this number has been exceeded, processing branches through a step 96 which clears the B counter recording those attempts and returns processing to step 72.

Assuming that the number of allowed attempts to read a discharge condition has not been reached, step 94 continues processing through a step 98 which creates a 30 millisecond delay and increments the B counter keeping track of discharge reading attempts. Processing returns to step 84 for another attempt to read the comparator outputs.

Assuming that step 92 determines that the outputs of the comparators 42 and 44 are below threshold, a discharge state exists, processing branches to a step 104 having a 30 millisecond delay while the B counter increments. Since last timeout at step 94, a subsequent step 112 reads the output of the latches 48 and 50 to determine whether during the 30 millisecond interval either latch was set. Processing branches to decision step 94 where one or both latches has been set, indicating a failure to retain discharge between two isolated time periods separated by the thirty millisecond interval. Processing from decision step 94 has already been discussed.

Where decision step 112 indicates that the latches 48 and 50 are still not set, an acceptable discharge is indicated and processing continues in a step 114 which activates the RF oscillator 36 and produces a settling interval of 30 milliseconds. Step 114 also activates a conductivity read sub-routine which initiates a 0.5 second timer and samples the output of the comparators 42 and 44 at 10 millisecond intervals to detect whether an N or a P type wafer has been detected. Five successive samples are monitored and if coincidence amongst them within the 0.5 second interval is detected, a good reading, a subsequent decision step 118 branches to step 80. A failed reading directs processing to step 96. The read sub routine is shown in FIG. 3B.

Figure 3B:
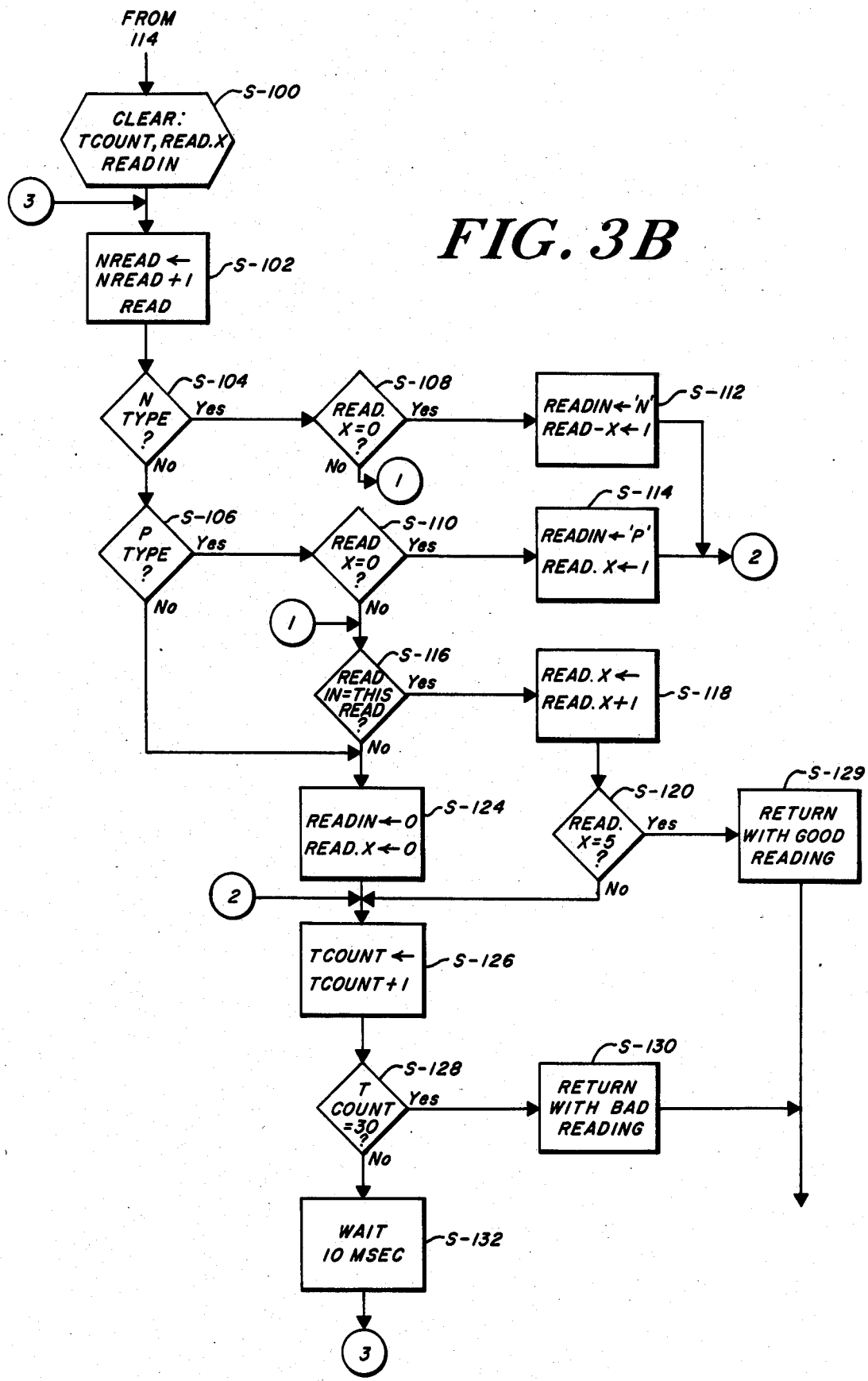

In FIG. 3B, a reading according to step 114 commences with a step S-100, clearing a set of counters including: T COUNT, a timer to identify the passage of 0.5 sec; READ-X, identifying the total number of consecutive good readings; and READIN, a register for the reading of comparators 42 and 44 as N, P, or neither. Subsequent to clear step S-100, step S-102 augments NREAD and reads the comparators 42 and 44. Subsequent decision steps S-104 and S-106 test for an N or P reading. An N or P reading causes a decision step S-108 or S-110 respectively to check the READ-X counter for an indication of no consecutive good readings. If there are none, subsequent steps S-112 or S-114 sets the READIN register to N or P respectively and the READ-X counter to 1 and follows the flow indicated. If READ-X was not 0 in either case, a decision step S-116 determines whether the READIN register, designating the prior reading is the same reading as the present. If this is the case, a subsequent step S-118 increments the READ-X count and a decision step S-120 checks whether READ-X has reached its maximum count, indicating five identical consecutive readings. If this condition exists, step S-122 returns processing to FIG. 3A with an indication of a successful reading.

Where step S-116 failed to indicate coincidence between consecutive results, a step S-124 resets the READIN register and READ-X counter.

Subsequent step 126, entered from steps S-124, S-120, S-114 or S-112 increments the TCOUNT counter. It is tested in decision step S-128 to see if the full 0.5 sec period has elapsed. If it has elapsed, processing leads to a step S-130 providing an indication of a bad reading. Otherwise, a step S-132 pauses 10 msec, the sampling interval, and returns to step S-102.

Figure 4:
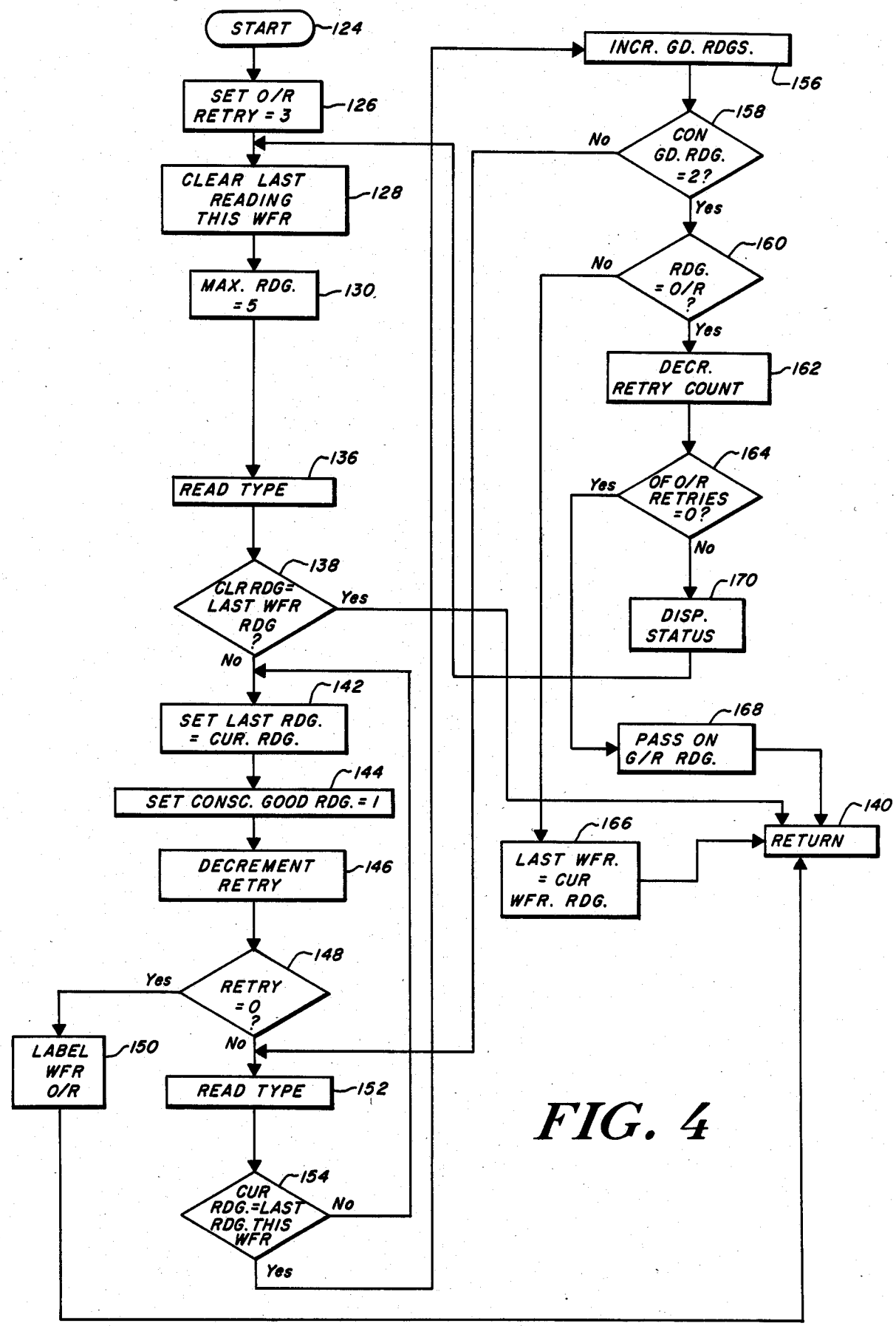
FIG. 4 is an algorithm illustrating the processor controlled functioning of FIG. 2, as controlled in accordance with the functioning of FIG. 3, to provide enhanced security to the indication of conductivity-type in accordance with the present invention.

Verification of type measurements made with respect to FIG. 3 is achieved in a processing algorithm illustrated in FIG. 4 and implemented by processor 52 of FIG. 2. From a start state 124, a series of initialization steps 126, 128, and 130 are executed. These set the cycle retry counter at a preselected number, in this case 3; clear the register holding the last reading of conductivity-type for the wafer positioned above the aperture 18; and set the maximum number of readings to be tried at 5. Subsequently, in step 134, a reading of wafer conductivity-type, essentially FIG. 3 processing, is executed. A decision step 138 determines whether the indicated conductivity-type reading in step 136 is the same as the conductivity type reading from the previous wafer as stored in a register of processor 52. If these two readings are identical, decision step 138 has satisfied the requirements for consecutive identical readings and processing branches to a return state 140 waiting for further instructions.

If the reading for the current wafer conductivity-type differs from that of the previous wafer, decision step 138 continues to a step 142 which sets a register placing in the last reading register the value of the current reading taken in step 136. A subsequent step 144 sets the continuous good reading register initialized in step 132 to the value "1" and passes to a step 146 which decrements the retry register initialized in step 126 to reflect one retry. A subsequent decision step 148 checks whether the maximum number of retries, initialized in step 126, has been exceeded. If positive, processing branches through a step 150 which designates the reading as an out-of-range reading and therefore not a good reading and places the processor in the return state 140. If the maximum number of retries has not been detected in step 148, a subsequent step 152 reexecutes the wafer conductivity-type read algorithm of FIG. 3 and continues to a decision step 154 which tests whether the reading of step 152 placed in the current reading register is the same as the reading in the last reading register established in step 142. If decision 154 is negative, processing returns to step 142 forming are read loop.

If decision step 154 indicates that the current reading is the same as the last reading, processing continues through a step 156 which increments the good readings register and continues processing to a decision step 158 which tests whether the good reading register is at 2. If step 158 is negative, processing returns to step 152 but if positive, proceeds to a decision step 160. Decision step 160 tests whether the reading in step 152 was an out-of-range reading. If not, indicating a good reading, processing branches through a step 166 which sets the last wafer equal to the current wafer reading, updating system status, and proceeds to return state 140.

In the case of a bad reading indication in step 160, a subsequent step 162 decrements the maximum reading counter set in step 130 and proceeds to a decision step 164. Step 164 detects whether the number of permissable out-of-range retries has been reached which, if so branches operation through a step 168 which permits the wafer to be moved out of the station with an indication applied to the processor that that wafer is defective in producing consistent out-of-range readings. If decision 164 does not indicate that the number of out-of-range retries has been reached, a step 170 is executed which displays the current processing status and returns processing back to the beginning of step 128, recommencing the entire type read confirmation loop.

The disclosure above provides for an accelerated discharge of wafers in combination with augmented reliability in achieving an acceptable discharge and an accurate reading of wafer conductivity-type. The scope of the invention thus described in particular implementation above, is to be determined solely from the following claims.

What is claimed is:

1. A semiconductor wafer conductivity-type detector system comprising:
   contacts for providing electrical and mechanical contact with a wafer and including an axially extending sharp tip portion adapted to provide such contact;
   means for selectively applying said contacts to a location on a semiconductor wafer;
   said contacts including an axially extending and sharp tip portion of greater hardness than said wafer which tip portion contacts said wafer at said location;
   means for sensing charge across said contacts as applied to said wafer whereby wafer charge is measured at said location;
   means for providing accelerated discharge through said contacts of the wafer charge at said location as sensed across said contacts by applying a charge having a polarity opposite the polarity of the charge sensed across said contacts; and
   means for determining wafer conductivity type of a discharged wafer through said contacts at said location.

2. The system of claims 1, wherein said tip portion is tungsten carbide.

3. The system of claim 1, wherein said means for determining conductivity-type includes means for requiring a predetermined number of consecutive indications of the same conductivity-type to provide an acceptable indication of type.

* * * * *

UNITED STATES PATENT AND TRADEMARK OFFICE
CERTIFICATE OF CORRECTION

PATENT NO. : 4,646,009
DATED : February 24, 1987
INVENTOR(S) : Roy Mallory

It is certified that error appears in the above-identified patent and that said Letters Patent is hereby corrected as shown below:

```
Column 4, line 7,     "sgnals" should read --signals--
         line 27,    "dischage" should read --discharge--

Column 5, line 56,   "sub routine" should read --sub-routine--

Column 6, line 63,   "are read loop" should read --a re-read
                     loop--

Column 7, lines 12-13,  "permissa-   should read --permissi-
                         ble"                      ble--

Column 8, line 24,   "claims 1," should read --claim 1,--
```

Signed and Sealed this

Nineteenth Day of July, 1988

Attest:

DONALD J. QUIGG

*Attesting Officer*     *Commissioner of Patents and Trademarks*